United States Patent [19]

Ko

[11] Patent Number: 5,475,320
[45] Date of Patent: Dec. 12, 1995

[54] DATA PROCESSING WITH A SELF-TIMED APPROACH TO SPURIOUS TRANSITIONS

[75] Inventor: Uming Ko, Plano, Tex.

[73] Assignee: Texas Instruments Incorporated, Dallas, Tex.

[21] Appl. No.: 289,073

[22] Filed: Aug. 11, 1994

[51] Int. Cl.$^6$ ............................................. H03K 19/003
[52] U.S. Cl. ........................ 326/21; 326/83; 365/233.5; 327/387
[58] Field of Search .................... 326/21, 93, 95, 326/98, 53, 83; 327/384, 386, 387, 142, 143; 365/233.5

[56] References Cited

U.S. PATENT DOCUMENTS

| | | | |
|---|---|---|---|
| 3,925,652 | 12/1975 | Miller | 326/53 |
| 4,039,858 | 8/1977 | Stewart | 326/52 |
| 4,775,840 | 10/1988 | Ohmori et al. | 326/21 |
| 4,940,904 | 7/1990 | Lin | 324/142 |
| 5,121,003 | 6/1992 | Willimas | 365/203 |
| 5,124,584 | 6/1992 | McClure | 365/233.5 |
| 5,194,768 | 3/1993 | Lozano | 326/21 |

OTHER PUBLICATIONS

John Compton and Alexander Albicki, "Self-Timed Pipeline with Adder," Dept. of Electrical Engineering, University of Rochester, IEEE 1992, pp. 109–113.

Y. K. Tan and Y. C. Lim, "Self-Timed Precharge Latch," Electrical Engineering Dept., National University of Singapore, Kent Ridge, Singapore 0511, 1990 IEEE, pp. 566–569.

Gordon M. Jacobs and Robert W. Brodersen, "A Fully Asynchronous Digital Signal Processor Using Self-Timed Circuits," IEEE Journal of Solid-State Circuits, vol. 25, No. 6, Dec. 1990, pp. 1526–1536.

*Primary Examiner*—Edward P. Westin
*Assistant Examiner*—Benjamin D. Driscoll
*Attorney, Agent, or Firm*—Scott B. Stahl; James C. Kesterson; Richard L. Donaldson

[57] ABSTRACT

A digital electronic device includes a digital circuit responsive to a logic transition at an input thereof to produce at an output thereof a spurious logic transition ultimately followed by a stable logic level. A transition detector produces a detection signal in response to the logic transition at the digital circuit input, the transition detector including a latch circuit having an output for producing the detection signal. A self-timed circuit receives the detection signal and, after delaying for a suitable time, produces a done signal. A switching circuit is responsive to the done signal to connect the digital circuit output to a selected logic node.

19 Claims, 5 Drawing Sheets

5,475,320

DATA PROCESSING WITH A SELF-TIMED APPROACH TO SPURIOUS TRANSITIONS

FIELD OF THE INVENTION

The present invention relates to data processing and, more particularly, to data processing applications in which low power consumption and high performance are important but disadvantageously affected by spurious transitions within the logic of the data processing circuitry.

BACKGROUND OF THE INVENTION

Data processing systems are used in myriad applications which touch virtually every aspect of life. In applications where the data processing system uses battery power for any substantial length of time, it is particularly desirable to be able to minimize the power consumption of the data processing system. Examples of systems wherein battery power is used for substantial periods of time include portable data processing systems such as notebook and sub-notebook computer systems, and data processing systems which are employed in remote locations, hazardous weather areas, or earthquake prone areas. As discussed below, spurious transitions are an important factor in power consumption.

Due to finite propagation delays from one logic block of the data processing circuitry to the next logic block, critical races, or dynamic hazards, are inherent in static logic designs, whether full static, complementary pass-gate logic (CPL), or double pass-gate logic (DPL). These dynamic hazards can cause a logic node to have multiple transitions within a single clock cycle before settling to the correct logic level. This unnecessary switching activity is referred to as spurious transitions, and in some circuits it can consume over 30% more energy than is required to perform the data processing computation for which those circuits are designed. Although dynamic logic such as pre-charged domino exhibits only one transition per clock cycle, it can have a considerable overhead in power due to clock signal loading, clock drivers and additional gate capacitances.

FIG. 1 illustrates the sum output waveforms from a 0.6 micron CMOS, 100 MHz, 32-bit carry look-ahead adder (CLA) implemented in double pass-gate logic. The amplitude and width of the spurious transitions, such as 11, 13 and 15, vary depending on the sequence of input patterns. In some cases, many spurious transitions can occur before a valid one, as in the train of spurious transitions at 15. These spurious transitions impact not only power consumption, but clearly can also adversely affect the functional operation of the adder.

One way to remove spurious transitions in static logic is to equalize the delay of multiple circuit paths, but this requires the addition of delay elements which consume power and make this approach impractical.

It is therefore desirable to provide a technique which reduces spurious transitions and also eliminates more power consumption than it introduces.

The present invention provides a technique for reducing spurious transitions at desired logic nodes within data processing circuitry, and the technique reduces more power consumption than it introduces.

DETAILED DESCRIPTION

Figure 2:
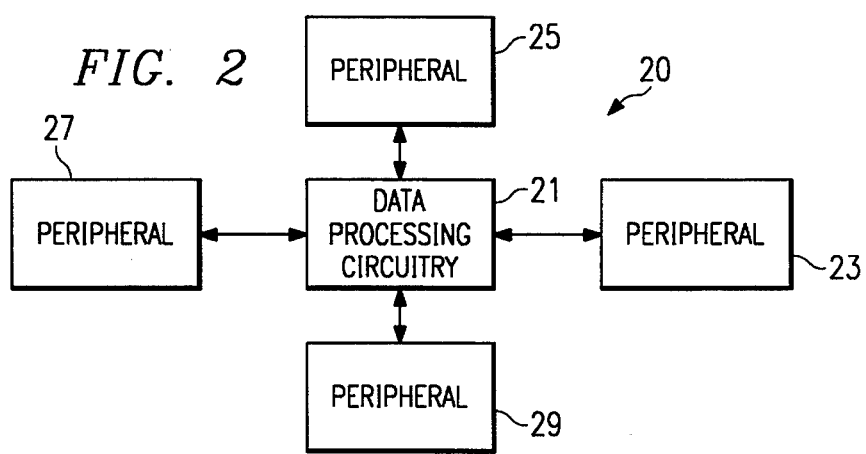
FIG. 2 is a block diagram of a data processing system according to the present invention.

FIG. 2 is a block diagram of a data processing system 20 according to the present invention. The data processing system 20 includes data processing circuitry 21, for example, a microprocessor, and peripheral devices 23, 25, 27 and 29. In the exemplary embodiment of FIG. 2, the data processing circuitry 21 is connected to each of the peripheral circuitries 23, 25, 27 and 29 for transfer of information between data processing circuitry 21 and peripheral circuitries 23, 25, 27 and 29. However, and as will be apparent from the following description, a data processing system according to the present invention could include any quantity and type of peripheral circuitries and peripheral devices (such as peripherals 23, 25, 27 and 29) inter-connected among themselves and with data processing circuitry 21 in any manner heretofore or hereafter conceivable to workers in the art. Examples are: data processing circuitry 21, a microprocessor; peripheral 23, a memory control unit for accessing a DRAM; peripheral 25, a bus control unit; peripheral 27, a non-volatile memory such as ROM or EPROM; and peripheral 29, a graphics control unit for interfacing with a graphics display unit. Other examples are: data processing circuitry 21, an adder circuit; peripheral 23, an on-chip cache; peripheral 25, an execution/load-store unit; and peripheral 27, a branch offset.

Figure 3:
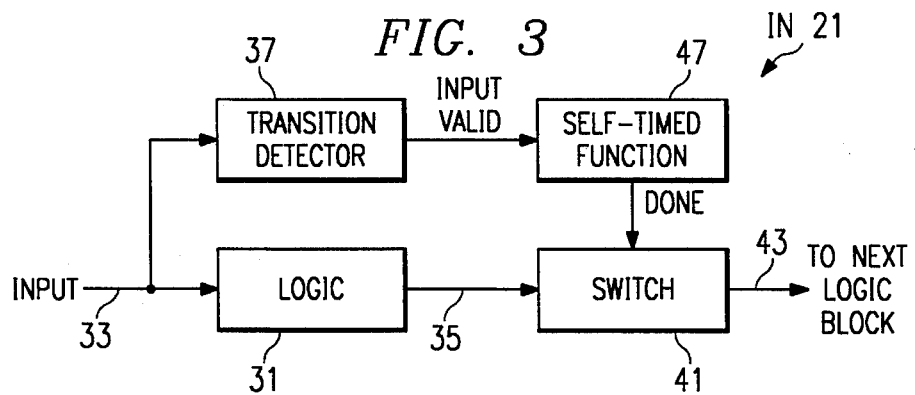
FIG. 3 is a block diagram of a portion of the data processing circuitry of FIG. 2.

FIG. 3 illustrates in more detail a portion of the data processing circuitry 21 of FIG. 2. Logic 31 receives inputs at 33 and performs functional operations in response thereto to provide outputs 35 which are subject to spurious transitions. A transition detector 37 detects transitions in the logic inputs 33, and outputs an input valid signal when a transition is detected. The input valid signal from the transition detector 37 is input to a self-timed function 47. The self-timed function 47 is designed to account for the amount of time, referred to herein as settling time, required for logic outputs 35 to settle to their final logic level in response to a transition at logic inputs 33. Thus, all spurious transitions occur during this settling time, and the logic outputs 35 are free of spurious transitions, also referred to as hazard-free, after the settling time has elapsed. Thus, upon receiving the input valid signal from the transition detector 37, the self-timed function 47 thereafter outputs a done signal when the settling time has elapsed. Switching circuitry 41 receives the done signal and responds thereto by connecting the hazard-free logic outputs 35 to the outputs 43 of switching circuitry 41 for connection to the next logic block. Thus, the spurious transitions are isolated from the next logic block in data processing circuitry 21, and only hazard-free outputs from logic 31 are ever connected to the next logic block in data processing circuitry 21.

Figure 4:
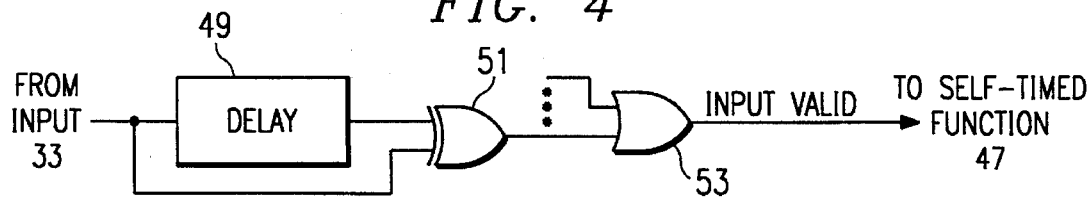
FIG. 4 illustrates one embodiment of the transition detector of FIG. 3.

FIG. 4 illustrates one example of the transition detector 37 of FIG. 3. The logic input from 33 is applied directly to an exclusive-OR gate 51 and also to the input of a delay line 49. The output of delay line 49 is connected to the other input of exclusive-OR gate 51. The output of exclusive-OR gate 51 is connected to the input of an OR gate 53. A delay line 49 and an exclusive-OR gate 51 are provided for each logic input 33. Thus, if the logic circuit 31 of FIG. 3 is a 32-bit adder circuit having a pair of 32-bit inputs, then a delay line 49 and an exclusive-OR gate 51 would be provided for each of the 64 bits being input into the adder circuit, thus totalling 64 delay lines 49 and 64 exclusive-OR gates 51. The input valid signal is produced by ORing the outputs of the 64 exclusive-OR gates 51, thus requiring OR gate 53 to be a 64 input OR gate. The input valid signal is then taken from the output of the 64 input OR gate 53 and fed to the self-timed function 47 of FIG. 3. As to operation, the output of exclusive-OR gate 51 will pulse high whenever a transition occurs at the associated logic input 33, and will remain high until the transition propagates through delay line 49. Delay line 49 may be realized by, for example, an even number of series-connected inverters.

Figure 5:
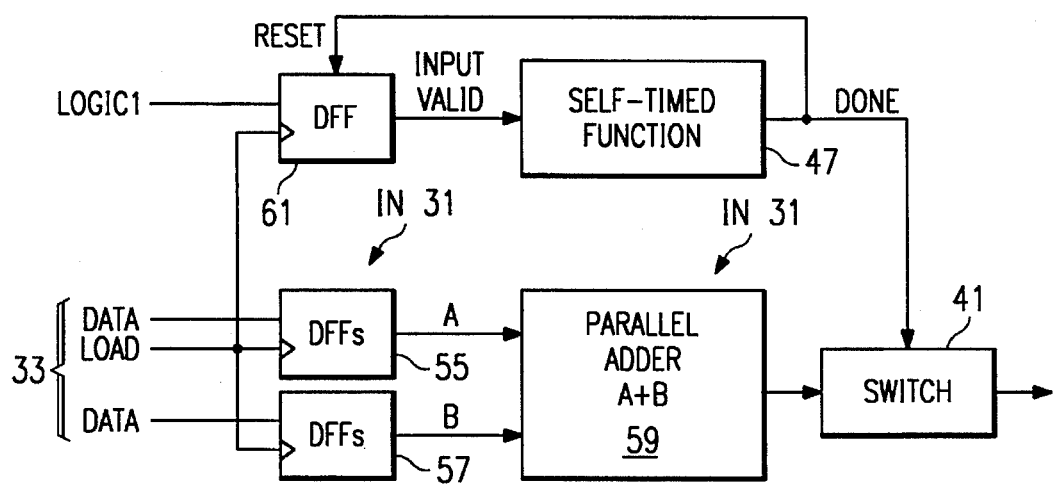
FIG. 5 illustrates another embodiment of the transition detector of FIG. 3.

FIG. 5 illustrates another example of the transition detector 37 of FIG. 3. For purposes of describing the exemplary transition detector structure of FIG. 5, it is assumed in FIG. 5 that the functional logic 31 of FIG. 3 includes a parallel adder circuit 59 having a pair of multiple-bit inputs A and B which are added together therein. The inputs A and B are latched into the adder 59 by D flip-flops (DFFs) at 55 and 57, respectively. The inputs A and B are thus loaded into the adder 59 by using a load signal to clock the flip-flops 55 and 57. This load signal is also used to clock a further D flip-flop 61 whose data input is tied to logic one. Thus, when new data inputs A and B are loaded into the adder 59 via flip-flops 55 and 57, a logic one is also clocked through flip-flop 61 which causes the input valid signal to go high at the input of self-timed function 47. The done signal output from self-timed function 47 is used to reset the flip-flop 61 so that the input valid signal goes low again when the done signal goes high. The exemplary transition detector of FIG. 5 is implemented with one flip-flop 61, or a single register bit or other latching circuit, regardless of the number of data inputs at 33. This is advantageous from the standpoint of power consumption and integrated circuit area.

Figure 6:
FIG. 6 illustrates one embodiment of the self-timed function of FIG. 3.

FIG. 6 illustrates one example of the self-timed function 47 of FIG. 3. In FIG. 6, the self-timed function is implemented with bit-slice logic which is literally a duplicate of the worst case path, timewise, through the logic circuit 31. For example, in a 32-bit parallel adder having a pair of 32-bit inputs, the worst case path would be the path of the most significant bit of either 32-bit input. Thus, the logic of the path of the most significant input bit is duplicated in the bit-slice logic of the FIG. 6 self-timed function.

Figure 7:
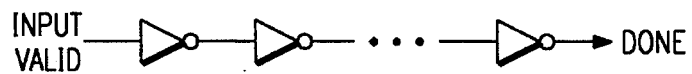
FIG. 7 illustrates another embodiment of the self-timed function of FIG. 3.

FIG. 7 illustrates another example of the self-timed function 47 of FIG. 3. In FIG. 7, a chain of inverters is arranged so as to mimic the delay time of the bit-slice logic of FIG. 6. Although inverters are illustrated in FIG. 7, a chain of other suitable delay elements will also suffice. The self-timed function of FIG. 7 will generally be less accurate than the bit-slice logic of FIG. 6, but is typically less costly in terms of power consumption and integrated circuit area.

Figure 9:
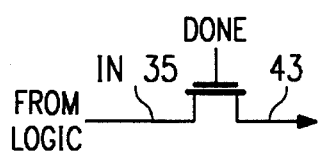
FIG. 9 illustrates one embodiment of the switch of FIG. 3.

FIG. 9 illustrates one example of the switching circuitry 41 of FIG. 3. In the example of FIG. 9, the switching function is accomplished by a pass-gate controlled by the done signal. Each signal within the output 35 from logic circuit 31 will require its own pass-gate. For example, the 32-bit output of a 32-bit adder circuit will require 32 pass-gates, all of which are controlled by the done signal from the self-timed function 47.

Figure 10:
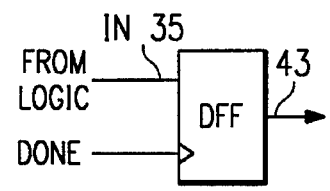
FIG. 10 illustrates another embodiment of the switch of FIG. 3.

FIG. 10 illustrates another example of the switching circuitry 41 of FIG. 3. In the example of FIG. 10, the switching function is performed by a D flip-flop having its clock input driven by the done signal. Each output 35 from the logic circuit 31 requires its own flip-flop, so that a 32-bit output will require 32 flip-flops.

Figure 8:
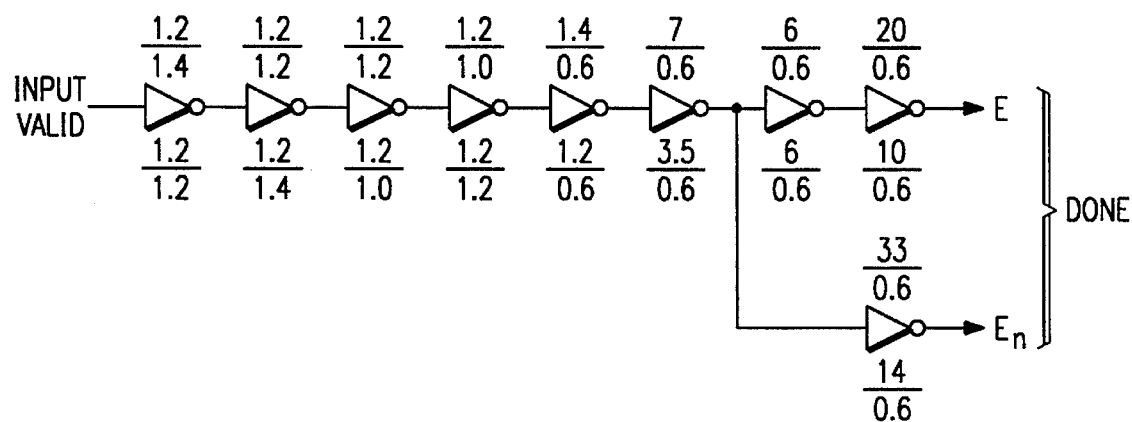
FIG. 8 illustrates another embodiment of the self-timed function of FIG. 3.

FIG. 8 illustrates another example of the self-timed function 47 of FIG. 3. The FIG. 8 example produces a dual rail done signal including signal E and its inverse signal $E_n$.

Figure 11:
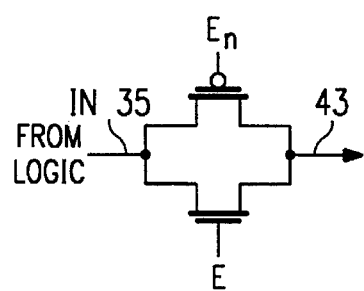
FIG. 11 illustrates another embodiment of the switch of FIG. 3.

FIG. 11 illustrates an example of the switching circuitry 41 of FIG. 3 which can be used in conjunction with the dual rail done signal generated by the self-timed circuitry of FIG. 8. In FIG. 11, an n-channel pass-gate and a p-channel pass-gate are arranged to provide parallel current paths between the logic output at 35 and the switch output at 43. Signal E from FIG. 8 controls the n-channel pass-gate and signal $E_n$ from FIG. 8 controls the p-channel pass-gate. Thus, when the input valid signal of FIG. 8 goes high, signal E is eventually driven high and signal $E_n$ is eventually driven low, thereby causing both pass-gates of FIG. 11 to conduct. Thirty-two switching elements of the type illustrated in FIG. 11 would be necessary to switch the 32-bit output of a 32-bit adder circuit. Assuming that the high-level of signal E arrives at the n-channel pass-gate at time $t_1$ and the low level of signal $E_n$ arrives at the p-channel pass-gate at time $t_2$, then the switching element of FIG. 11 operates most advantageously if the time difference between times $t_1$, and $t_2$ is less than or equal to the propagation delay of the FIG. 11 pass-gates, assuming their propagation delays are about equal. The transistors of the inverters in the self-timed circuit of FIG. 8 are therefore preferably tuned so that this relationship between arrival times of signals E and $E_n$ is achieved.

FIG. 8 illustrates one exemplary tuning arrangement for the transistors. The pair of numbers above each inverter in FIG. 8 represents the channel width and channel length parameters of the p-channel transistor of that particular inverter, and the pair of numbers below each inverter represents the channel width and channel length parameters of the n-channel transistor of that particular inverter. Within each pair of numbers, the upper number is the width parameter and the lower number is the length parameter. The parameters of FIG. 8 provide the desired relationship between signals E and $E_n$, assuming Texas Instruments' Epic-3 0.6 micron CMOS process. The arrangement of FIG. 8 is provided for use with the adder discussed above with respect to FIG. 1, and thus implements a delay corresponding to the worst case bit-slice of that adder. Regardless of the delay to be implemented, however, the above-described timing relationships between E and $E_n$ should preferably be maintained.

It should also be noted that the self-timed circuitries of FIGS. 6 and 7 can be modified for use in conjunction with the switching circuitry of FIG. 11. More specifically, FIGS. 6 and 7 could each be modified to provide a dual rail signal by simply adding one inverter to invert the output of each embodiment so that a dual rail signal is developed to drive the switching element of FIG. 11. However, this type of dual rail signal would not meet the timing criteria previously discussed with respect to the dual rail signals of FIG. 8, and thus the dual rail signals obtained from FIGS. 6 and 7 would not control the switching element of FIG. 11 as advantageously as the dual rail signals developed in FIG. 8.

Figure 12:
FIG. 12 illustrates the output structure of a conventional parallel adder circuit.

FIG. 12 illustrates the output structure of a conventional adder circuit, wherein the sum output $S_{i+1}$, is obtained by exclusive-ORing the current propagation $P_{i+1}$ and the previous carry $C_i$. A 32-bit adder circuit would include 32 exclusive-OR gates as shown in FIG. 12.

Figure 13:
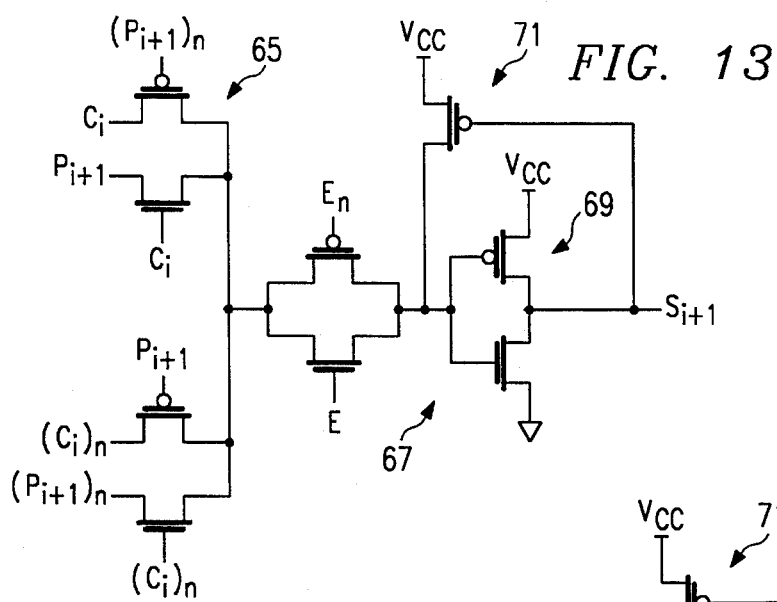
FIG. 13 illustrates one example of an output structure of a parallel adder circuit according to the present invention.

FIG. 13 illustrates an exemplary output structure for an adder circuit according to the present invention. The output structure of FIG. 13 includes an exclusive-NOR gate 65 connected to an inverter/latch circuit 67 by the switching circuitry of FIG. 11. In the exclusive-NOR gate 65, the signal designated as $(P_{i+1})_n$ is the inverse of the current propagation $P_{i+1}$, and the signal designated as $(C_i)_n$ is the inverse of the previous carry $C_i$. The inverter/ latch circuitry 67 includes an inverter 69 having its input connected to the output of the FIG. 11 switching element, and providing the sum output $S_{i+1}$ as its output. The latching function of circuitry 67 is provided by a p-channel pass-gate 71 which is controlled by the sum output $S_{i+1}$. When the sum output $S_{i+1}$ is logic zero, the pass-gate 71 connects $V_{cc}$ to the input of inverter 69, thereby latching the logic zero output at $S_{i+1}$. When sum output $S_{i+1}$ is logic one, the pass-gate 71 is non-conductive so as not to interfere with the logic zero input at inverter 69.

Figure 13A:
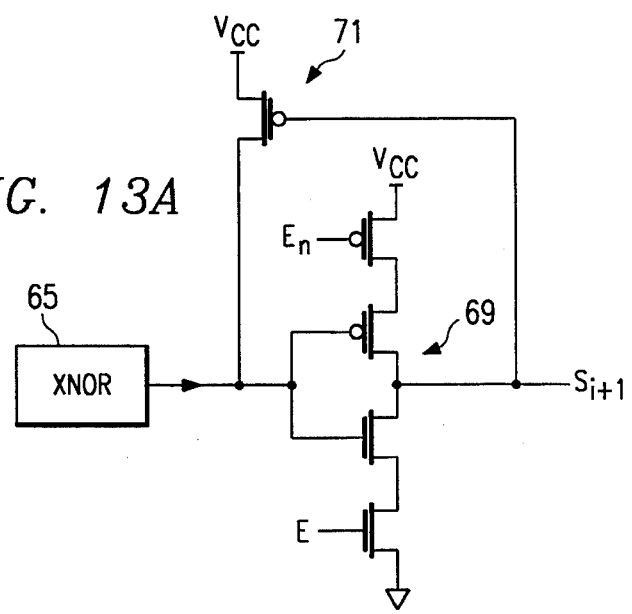
FIG. 13A illustrates another example of an output structure of a parallel adder circuit according to the present invention.

FIG. 13A illustrates an output structure similar to FIG. 13, except the output of exclusive-NOR gate 65 is directly connected to the input of inverter 69, and signals E and $E_n$ are used to activate inverter 69.

Figure 1:
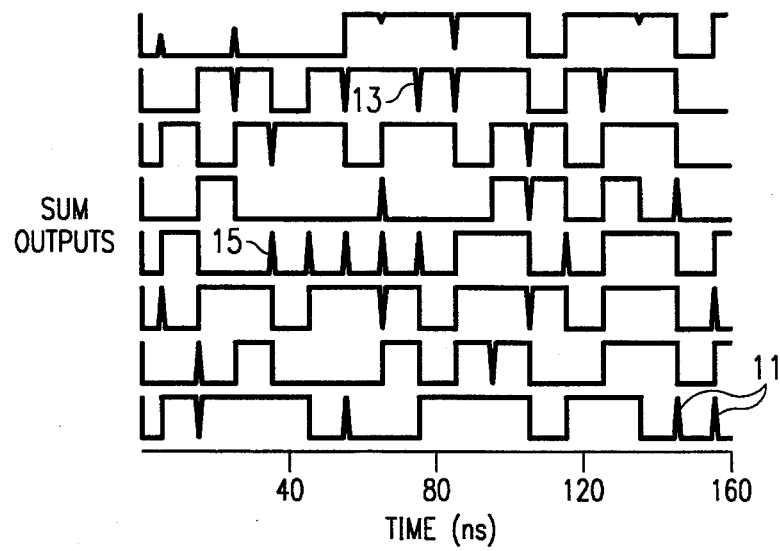
FIG. 1 is a timing diagram which illustrates the waveforms of selected sum outputs of a conventional adder circuit.
Figure 14:
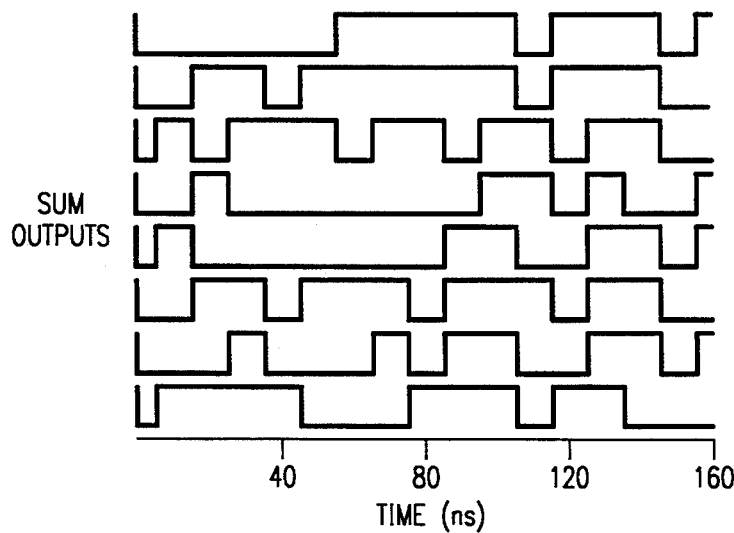
FIG. 14 is a timing diagram showing sum output waveforms produced by the adder output circuitry of FIG. 13.

FIG. 14 illustrates the results obtained by applying the spurious transition reduction circuitry of FIG. 3 —including the transition detector of FIG. 5, the self-timed circuitry of FIG. 8 and the switching circuitry of FIG. 11 —to a conventional adder. More specifically, FIG. 14 illustrates the results obtained at the output 43 of the FIG. 11 switching element when the data inputs 35 to the FIG. 11 switching element are the sum output waveforms of the prior art adder as shown in FIG. 1. As seen from FIG. 14, the spurious transitions of FIG. 1 are not seen at the outputs of the FIG. 11 switching elements.

Figure 15:
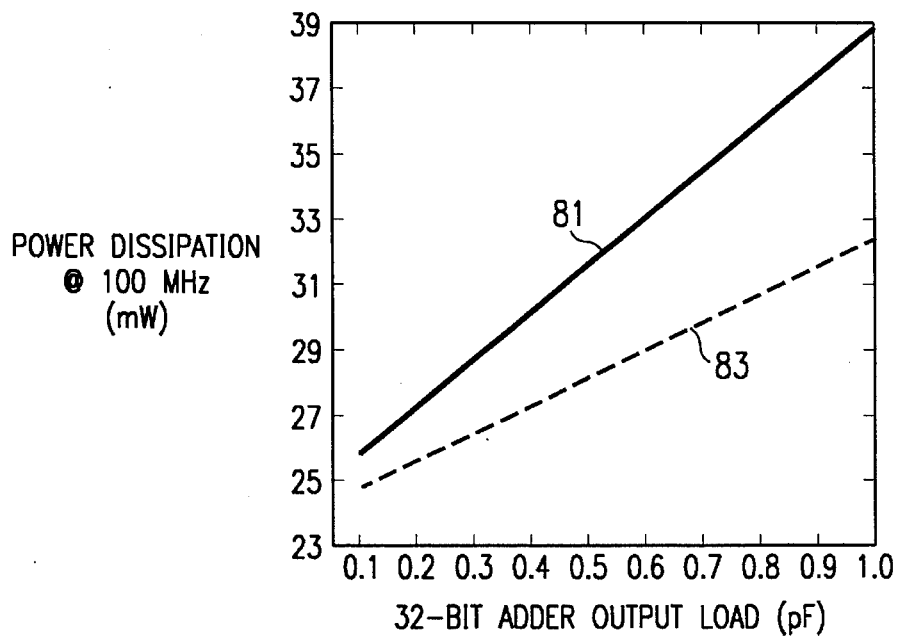
FIG. 15 is a graphical comparison of the power dissipation of a conventional adder circuit and an adder circuit having the output structure of FIG. 13.

FIG. 15 provides a graphical comparison of the power consumption of a conventional adder (solid line 81) and an adder which incorporates the spurious transition removal techniques of the present invention (broken line 83). The results indicated by the broken line 83 are obtained utilizing the adder output structure of FIG. 13, the self-timed circuitry of FIG. 8, and the transition detector 61 of FIG. 5.

As shown in FIGS. 14 and 15, the additional circuitry required to remove the spurious transitions of FIG. 1 increases the power consumption of the adder by an amount which is less than the reduction in power consumption due to removal of spurious transitions. Thus, the spurious transition removal techniques of the present invention remove more power consumption than they introduce. The techniques can be applied to any static circuit implementation, at any level of design hierarchy where power and performance are important.

Figure 16:
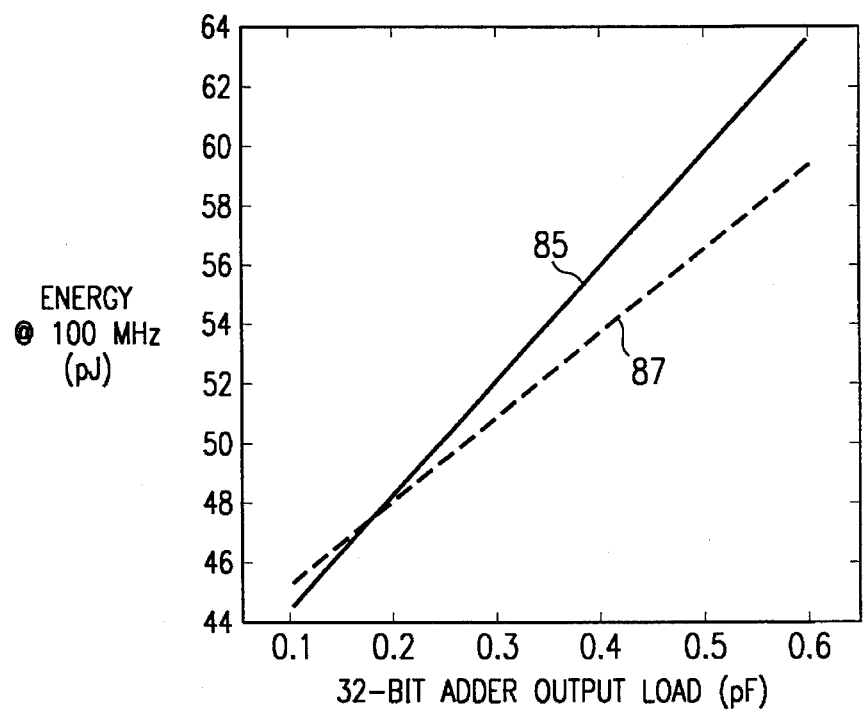
FIG. 16 is a graphical comparison of the energy efficiency of a conventional adder circuit and an adder circuit having the output structure of FIG. 13.

FIG. 16 depicts energy efficiencies corresponding to the power consumptions of FIG. 15, the solid line 85 being conventional, and the broken line 87 being the present invention. The crossover point indicates that energy optimization can be done given the output loading conditions.

Although exemplary embodiments of the present invention are described above, this does not limit the scope of the invention, which can be practiced in a variety of embodiments.

What is claimed is:

1. A digital electronic device, comprising:

digital circuitry having a plurality of inputs and responsive to a logic transition at one of said inputs to produce at an output thereof a spurious logic transition ultimately followed, after a settling time has elapsed since said input logic transition, by a stable logic level;

a transition detector for detecting an occurrence of a logic transition at any of said inputs and producing a detection signal indicative of said occurrence, said transition detector including a latch circuit having an output for producing said detection signal;

a self-timed circuit connected to said latch circuit output for receiving said detection signal and, after delaying for an amount of time which is approximately equal to said settling time, producing a done signal; and switching circuitry having a data input connected to said output of said digital circuitry and having a control input for receiving said done signal from said self-timed circuit, said switching circuitry responsive to said done signal to connect said data input thereof to a data output thereof.

2. The device of claim 1, wherein said done signal produced by said self-timed circuit is a dual rail signal.

3. The device of claim 2, wherein said switching circuitry includes an n-channel pass-gate and a p-channel pass-gate arranged to provide parallel current paths between said data input and said data output of said switching circuitry, said n-channel pass gate and said p-channel pass-gate being controlled by said dual rail done signal so that said n-channel pass-gate and said p-channel pass-gate are both switched from their non-conductive states to their conductive states within a period of time no longer than a propagation delay of one of said pass gates.

4. The device of claim 1, including latching circuitry for applying said logic transitions to said inputs of said digital circuitry, said latching circuitry having a clock input connected to a clock signal, said clock signal also connected to a clock input of said latch circuit of said transition detector.

5. The device of claim 4, wherein said latch circuit of said transition detector includes a data input connected to a fixed logic level.

6. The device of claim 5, wherein said latch circuit of said transition detector includes a reset input connected to said done signal.

7. The device of claim 1, wherein said latch circuit includes a reset input connected to said done signal.

8. The device of claim 1, wherein said digital circuitry includes a parallel adder circuit.

9. The device of claim 8, wherein said parallel adder circuit is a CMOS circuit.

10. A data processing system, comprising:

data processing circuitry for performing data processing operations;

peripheral circuitry connected to said data processing circuitry for communication with said data processing circuitry; and said data processing circuitry including digital circuitry having a plurality of inputs and responsive to a logic transition at one of said inputs to produce at an output thereof a spurious logic transition ultimately followed, after a settling time has elapsed since said input logic transition, by a stable logic level, a transition detector for detecting an occurrence of a logic transition at any of said inputs and producing a detection signal indicative of said occurrence, said transition detector including a latch circuit having an output for producing said detection signal, a self-timed circuit connected to said latch circuit output for receiving said detection signal and, after delaying for an amount of time which is approximately equal to said settling time, producing a done signal, and switching circuitry having a data input connected to said output of said digital circuitry and having a control input for receiving said done signal from said self-timed circuit, said switching circuitry responsive to said done signal to connect said data input thereof to a data output thereof.

11. The system of claim 10, wherein said done signal produced by said self-timed circuit is a dual rail signal.

12. The system of claim 11, wherein said switching circuitry includes an n-channel pass-gate and a p-channel pass-gate arranged to provide parallel current paths between said data input and said data output of said switching circuitry, said n-channel pass gate and said p-channel pass-gate being controlled by said dual rail done signal so that said n-channel pass-gate and said p-channel pass-gate are both switched from their non-conductive states to their conductive states within a period of time no longer than a propagation delay of one of said pass gates.

13. The system of claim 10, wherein said data processing circuitry includes latching circuitry for applying said logic transitions to said inputs of said digital circuitry, said latching circuitry having a clock input connected to a clock signal, said clock signal also connected to a clock input of said latch circuit of said transition detector.

14. The system of claim 13, wherein said latch circuit of said transition detector includes a data input connected to a fixed logic level.

15. The system of claim 14, wherein said latch circuit of said transition detector includes a reset input connected to said done signal.

16. The system of claim 10, wherein said latch circuit includes a reset input connected to said done signal.

17. The system of claim 10, wherein said digital circuitry includes a parallel adder circuit.

18. They system of claim 17, wherein said parallel adder circuit is a CMOS circuit.

19. A method of isolating a spurious logic transition, comprising the steps of:

detecting an occurrence of a logic transition at an input of a digital circuit, and using a latch circuit to produce a detection signal indicative of said occurrence;

in response to the occurrence of the logic transition at the input of the digital circuit, producing a spurious logic transition at an output of the digital circuit;

in response to production of said detection signal, delaying for an amount of time adequate to permit said digital circuit output to reach a stable logic level, and thereafter producing a done signal; and connecting said digital circuit output to an input of another digital circuit in response to said done signal.

* * * * *